(12) United States Patent
Carley

(10) Patent No.: US 7,008,812 B1
(45) Date of Patent: Mar. 7, 2006

(54) MANUFACTURE OF MEMS STRUCTURES IN SEALED CAVITY USING DRY-RELEASE MEMS DEVICE ENCAPSULATION

(75) Inventor: L. Richard Carley, Sewickley, PA (US)

(73) Assignee: IC Mechanics, Inc., Pittsburgh, PA (US)

( * ) Notice: Subject to any disclaimer, the term of this patent is extended or adjusted under 35 U.S.C. 154(b) by 0 days.

(21) Appl. No.: 09/583,386

(22) Filed: May 30, 2000

(51) Int. Cl.
*H01L 21/3065* (2006.01)

(52) U.S. Cl. ...................................................... 438/52
(58) Field of Classification Search ............ 438/50–53, 438/725
See application file for complete search history.

(56) References Cited

U.S. PATENT DOCUMENTS

| | | | | |
|---|---|---|---|---|
| 5,083,857 A | * | 1/1992 | Hornbeck | 359/291 |
| 5,285,131 A | | 2/1994 | Muller et al. | |
| 5,314,572 A | * | 5/1994 | Core et al. | 156/643 |
| 5,493,177 A | * | 2/1996 | Muller et al. | 313/578 |
| 5,573,679 A | * | 11/1996 | Mitchell et al. | 216/2 |
| 5,578,976 A | * | 11/1996 | Yao | 200/181 |
| 5,683,591 A | * | 11/1997 | Offenberg | 216/2 |
| 5,798,283 A | * | 8/1998 | Montague et al. | 438/24 |
| 5,834,333 A | * | 11/1998 | Seefeldt et al. | 438/409 |
| 6,238,580 B1 | * | 5/2001 | Cole et al. | 216/2 |
| 6,441,451 B1 | * | 8/2002 | Ikeda et al. | 257/418 |

FOREIGN PATENT DOCUMENTS

| | | |
|---|---|---|
| EP | 0 624 900 A2 | 4/1994 |
| EP | 0624900 A2 * | 11/1994 |

OTHER PUBLICATIONS

The article to Storment, et al. entitled, "Flexible dry-released process for aluminum electrostatic actuators," Journal of Microelectromechanical Systems, 3(3), Sep. 1994, IEEE, pp. 90-96.*

Wolf, et al. Silicon Processing for the VLSI Era, vol. 1-Process Technology, Lattice Press: Sunset Beach CA, 1986, pp. 428-429.*

G.K. Fedder, S. Santhanam, M.L. Reed, S.C. Eagle, D.F. Guillou, M.S.-C Lu, and L. Richard Carley, Laminated High-Aspect-Ratio Microstructures in a Conventional CMOS Process, 9th IEEE International Workshop on Micro Electro Mechanical Systems, San Diego, CA USA, Feb. 11-15, 1996.

G.K. Fedder, S. Santhanam, M.L. Reed, S.C. Eagle, D.F. Guillou, M.S._C. Lu and L. Richard Carley, Laminated High-Aspect-Ratio Microstructures in a Conventional CMOS Process, Sensors & Actuators A, vol. 57, No. 2, Mar. 1997, pp. 103-110.

G.K. Fedder, Integrated Microelectromechanical Systems in Conventional CMOS, 1997 IEEE Int. Symposium on Circuits and Systems, Hong Kong, Jun. 9-12, 1997, v. 4, pp. 2821-2824.

(Continued)

*Primary Examiner*—Carl Whitehead, Jr.
*Assistant Examiner*—Jennifer M Dolan
(74) *Attorney, Agent, or Firm*—Greenberg Traurig, LLP

(57) ABSTRACT

The disclosed fabrication methodology addresses the problem of creating low-cost micro-electro-mechanical devices and systems, and, in particular, addresses the problem of delicate microstructures being damaged by the surface tension created as a wet etchant evaporates. This disclosure demonstrates a method for employing a dry plasma etch process to release encapsulated microelectromechanical components.

6 Claims, 10 Drawing Sheets

OTHER PUBLICATIONS

G.K. Fedder, CMOS-Based Microstructures with Lateral Electrostatic Actuation, 1996 Sensors Expo Philadelphia Conf., Philadelphia, PA Oct. 22-24, 1996, pp. 131-135.

D.A. Koester, R. Mahadevan, B. Hardy and K. Markus, MUMPs Design Handbook, Cronos Integrated Microsystems, N.C., rev. 3, Oct. 1994.

J.H. Smith, S. Montague, J.J. Sniegowski, J.R. Murray and P.J. McQhorter, Embedded Micromechanical Devices for the Monolithic Integration of MEMS with CMOS, IEDM, 1995, pp. 609-612.

M. Parameswaran, A.M. Robinson, D.L. Blackburn, M. Gaitan and J. Geist, Micromachined Thermal-Radiation Emitter from a Commercial CMOS Process, 1991 IEEE, vol. 12, No. 2, pp. 57-59.

X.C. Jin, I. Ladabaum, B.T. Khuri-Yakub, Surface Micromachined Capacitive Ultrasonic Immersion Transducers, IEEE MEMS Conference, Heidelberg Germany, Jan. 1998.

Q.B. Zou, Z.M. Tan, Z.F. Wang, M.K. Lim, R.M. Lin, S. Yi and Z.J. Li, Design and Fabrication of a Novel Integrated Floating-Electrode-Electret-Microphone (FEEM), IEEE MEMS Conference, Heidelberg Germany, Jan. 1998.

Gianchandani, Y.B., Kim, H., Shinn, M., Ha, B., Lee, B., Najafi, K. and Song, C., "A MEMS-First Fabrication Process for Integrating CMOS Circuits with Polysilicon Microstructures", 1998 IEEE, pp. 257-262.

Kniffin, Margaret L., Shah, Mahesh, "Packaging for Silicon Micromachined Accelerometers", The International Society for Hybrid Microelectronics, vol. 19, No. 1, First Quarter 1996, pp. 75-86.

G.K. Fedder, S. Santhanam, M.L. Reed, S.C. Eagle. D.F. Guillou, M.S.-C LU, and L. Richard Carley, Laminated High-Aspect-Ratio Microstructures in a Conventional CMOS Process, 9th IEEE. International Workshop on Micro Electro Mechanical Systems, San Diego, CA USA, Feb. 11-15, 1996

G.K. Fedder, S. Santhanam, M.L. Reed, S.C. Eagle. D.F. Guillou, M.S.-C LU, and L. Richard Carley, Laminated High-Aspect-Ratio Microstructures in a Conventional CMOS Process, Sensors & Actuators A, vol. 57, No. 2, Mar. 1997, pp. 103-110.

G.K. Fedder, Integrated Microelectromechanical Systems in Conventional CMOS, 1997 IEEE Int. Symposium on Circuits and Systems, Hong Kong, Jun. 9-12, 1997, v. 4, pp. 2821-2824.

G.K. Fedder, CMOS-Based Microstructures with Lateral Electrostatic Actuation, 1996 Sensors Expo Philadelphia Conf., Philadelphia., PA Oct. 22-24, 1996, pp. 131-135.

D.A. Koester, R. Mahadevan, B. Hardy and K. Markus MUMPs Design Handbook, Cronos Integrated Microsystems, N.C., rev. 3, Oct. 1994.

J.H Smith, S. Montague, J.J. Sniegowski, J.R. Murray and P.J. McQhorter, Embedded Micromechanical Devices for the Monolithic Integration of MEMS with CMOS, IEDM, 1995, pp. 609-612.

M. Parameswaran, A.M. Robinson, D.L. Blackburn, M. Gaitan and J. Geist, Micromachined Thermal-Radiation Emitter from a Commerical CMOS Process, 1991 IEEE, vol. 12, No. 2, pp. 57-59.

X.C. JIN, I. LADABAUM, B.T. KHURI-YAKUB, Surface Micromachined Capacitive Ultrasonic Immersion Transducers, IEEE MEMS Conference, Heidelberg Germany, Jan. 1998.

Q.B. ZOU, Z.M. TAN, Z.F. WANG, M.K. LIM, R.M. LIN, S. YI and Z.J. LI, Design and Fabrication of a Novel Integrated Floating-Electrode-Electret-Microphone (FEEM), IEEE MEMS Conference, Heidelberg Germany, Jan. 1998.

Gianchandani, Y.B., Kim, H., Shinn, M., Ha, B., Lee, B., Najafi, K. and Song, C., "A MEMS-First Fabrication Process for Integrating CMOS Circuits with Polysilicon Microstructures", 1998 IEEE, pp. 257-262.

Kniffin, Margaret L., Shah, Mahesh, "Packaging for silicon Micromachined Accelorometers", The International Society for Hybrid Microelectronics, vol. 19, No. 1, First Quarter 1996, pp.75-86.

Gianchandani, Y.B., Kim, H., Shinn, M., Ha, B., Lee, B., Najafi, K. and Song, C., "A MEMS-First Fabrication Process for Integrating CMOS Circuiuts with Polysilicon Microstructures", 1998 IEEE, pp. 257-262.

Kniffin, Margaret L. Shah, Mahesh, "Packaging for Silicon Micromachined Accelerometers", The International Society for Hybrid Microelectronics, vol. 19, No. 1, First Quarter 1996, pp. 75-86.

* cited by examiner

MANUFACTURE OF MEMS STRUCTURES IN SEALED CAVITY USING DRY-RELEASE MEMS DEVICE ENCAPSULATION

FIELD OF THE INVENTION

This invention relates to the process of manufacturing micro-electro-mechanical systems (MEMS), and, in particular, to MEMS devices having sealed cavities or encapsulated movable parts.

BACKGROUND OF THE INVENTION

This disclosure builds on prior art describing a method for constructing micro-electro-mechanical systems by using multiple sacrificial thin film layers removed using a liquid etch.

It is known in the prior art to create sealed cavities on an integrated circuit for a variety of applications, for example, as a speaker or microphone. It is also known to encapsulate movable mechanical components on an integrated circuit within a sealed cavity. The encapsulation of micro-electro-mechanical structures in a sealed cavity is desirable for several reasons. First, the tolerance of the structures to ambient conditions, such as high humidity, is greatly improved. Second, the dicing and packaging of the MEMS devices is greatly facilitated. Third, when the cavity is at a low or very low ambient pressure, the Brownian noise due to the motion of gas molecules can be significantly reduced.

Processes to create sealed cavities on the surface of a silicon wafer using only thin film deposition and etching techniques have already been developed to create MEMS microphones and speakers for sound and ultrasound. Starting with a silicon substrate, which could in principle have CMOS devices and interconnects already patterned onto it, a protective layer is placed over the entire wafer. Next a sacrificial layer is deposited. Then, the sacrificial layer is patterned to remove it over all parts of the wafer that are not going to be microencapsulated. Next, an encapsulating layer is deposited over the entire wafer. Very small holes are then patterned and etched through the encapsulating layer at selected positions over the sacrificial layer, and the wafer is immersed in a liquid chemical bath containing an etchant that is highly selective, to dissolve the sacrificial layer while not attacking the encapsulating layer or the protective layer. Finally, an insulating or conducting layer that will act to seal the membrane must be deposited onto the wafer. The etch access hole can be sealed off either by material accumulating up from or by material depositing laterally on the sides of the hole growing inward and sealing off the hole. In either case, the final layer serves to both plug the etch holes and to seal the cavity created when the sacrificial material was etched away.

It is also known to create MEMS microstructures within sealed cavities such as the one described above. See, for example, U.S. Pat. Nos. 5,285,131 and 5,493,177 (both to Muller, et al.) in which methods to create an incandescent lamp and a vacuum tube respectively are disclosed. The method disclosed is as follows. A silicon substrate is covered with a non-etchable protective layer that is selectively removed, thereby exposing the silicon wafer in the region to be encapsulated. Then, a layer of poly-silicon is deposited and patterned to cover the exposed silicon window and extending up onto the silicon nitride protection layer in selected positions that will be used as entry points for the liquid etching agents. Non-etchable conductors are then deposited and patterned on top of both the non-etchable mask layer and on top of the silicon substrate in the window. Next, a sacrificial layer is deposited and etched so that it only covers the structures in the region to be encapsulated. The encapsulation process proceeds with the deposition of an encapsulation layer and the etching of small holes in the encapsulation layer located over the poly-silicon above the protection layer that will guide the etching agents into the cavity. In this case, the etching step requires two different liquid etchants—the first one to selectively etch away silicon and poly-silicon and a second one to etch away the sacrificial layer. The encapsulation process is completed by depositing a seal layer to seal up the etch entry holes in the diaphragms.

It is desirable to use a wet etchant, in many cases hydro-fluoric acid, because of its high degree of selectivity, that is, the ability to selectively etch away the sacrificial layers, leaving behind the microstructure and cavity walls. However, one unfortunate problem when working with a "wet" etchant is that the surface tension generated as the liquid evaporates can be strong enough to bend or even break delicate MEMS microstructures. Therefore, the use of liquid etching agents severely limits the complexity of the MEMS microstructures that can be released from sacrificial layers in the cavity because only simple MEMS microstructures can tolerate the surface tension forces exerted by typical liquid etching agents as the surface is drying. MEMS devices having suspended structures have been developed using a wet release etch. However, the structures were quite simple, for example, wires supported at both ends with a small number of meanders. However, in order to create a wide range of MEMS devices, for example, acceleration sensors, quite flexible MEMS structures are necessary. These flexible structures would most likely be destroyed by the surface tension effects of a wet etch.

It is therefore desirable to create MEMS structures without the wet etch step, eliminating potential damage to delicate MEMS structures by the surface tension created by the wet etchant. Such a process would improve yields of the devices, thereby making their production more economical. Additionally, more complex structures could be developed.

SUMMARY OF THE INVENTION

The disclosed invention specifies improvements to the known MEMS fabrication process by selecting a combination of layers for the MEMS structural layers, seal layer and the sacrificial layers that allows release of the microstructures using a dry plasma etchant. Ideally, the dry etchant would have a high etch rate for the material composing the sacrificial layers and a low etch rate with respect to the material composing the structural and seal layers. This eliminates the undesirable liquid surface tension inherent in the wet etch process.

DETAILED DESCRIPTION

Figure 1A:
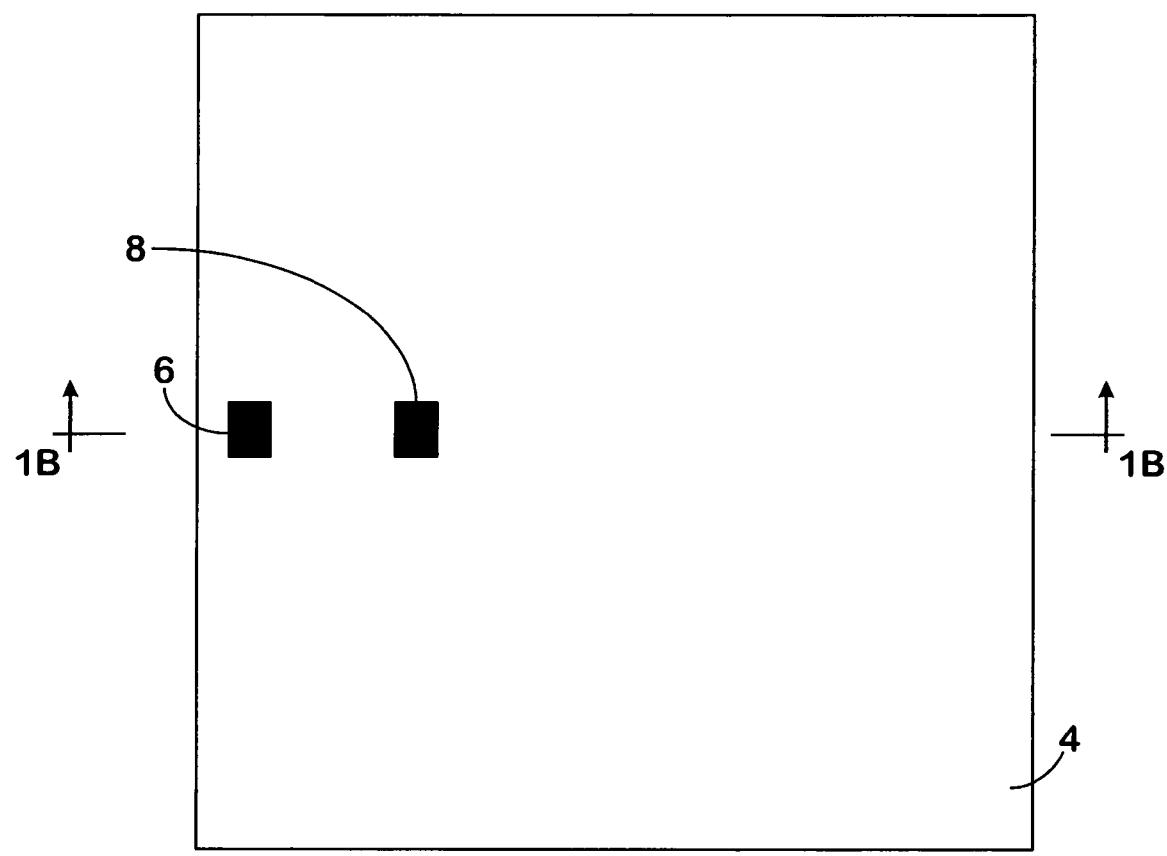
FIGS. 1A and 1B show a top view and a side cross-sectional view respectively of the silicon CMOS wafer used as the base of the MEMS micro-encapsulated structure.
Figure 1B:
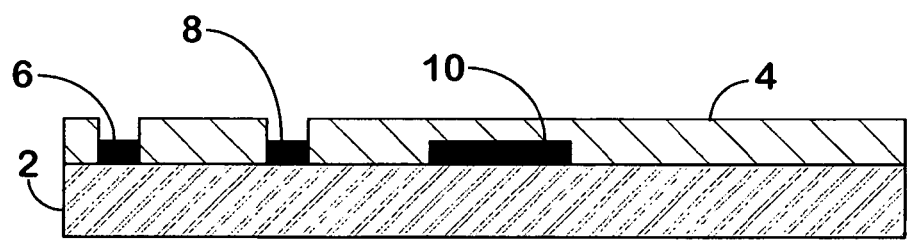

In general, the invention disclosed refers to gas phase release of any number of microstructure layers whose movement is independent or coupled and which are encapsulated in the thin film seal layer. However, in order to explain the invention, one specific embodiment will be described in detail below, namely a microstructure that can be utilized as a Z-axis accelerometer. This device consists of a paddle shaped MEMS microstructure anchored at one point by a thin supporting member such that it can move vertically within the sealed cavity.

FIGS. 1–9 illustrate the sequence of steps comprising the fabrication of the proposed encapsulated integrated microstructure CMOS process. We start by obtaining or fabricating a silicon CMOS wafer 2 coated with a layer of silicon nitride 4 and having metal pads interfacing to the original CMOS integrated circuit 6, 8 and 10 present as shown. Openings appear in the silicon nitride layer 4 to allow access to metal pads 6 and 8. In the preferred embodiment, the metal pads would be aluminum, but may alternatively be copper or any other conductive material.

Figure 2A:
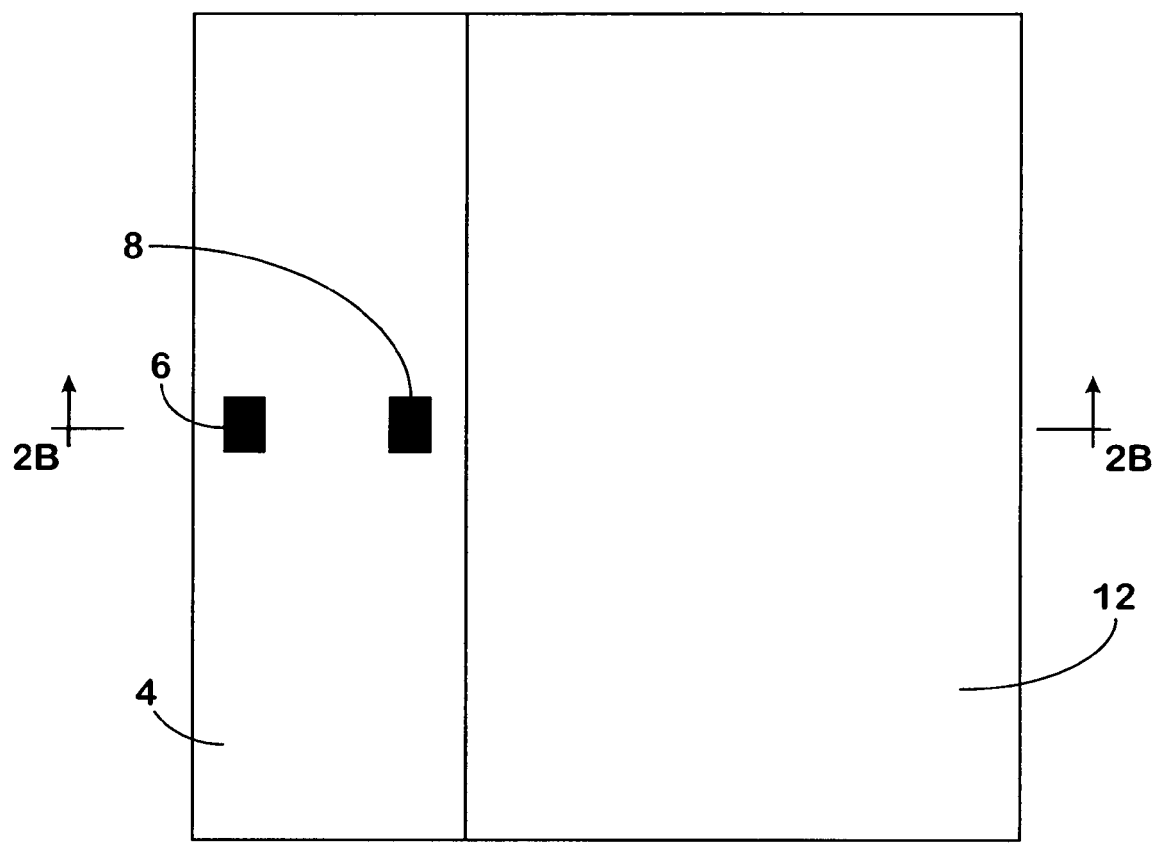
FIGS. 2A and 2B show a top view and a cross-sectional view respectively of the wafer of the FIG. 1A with a sacrificial layer deposited thereon.
Figure 2B:
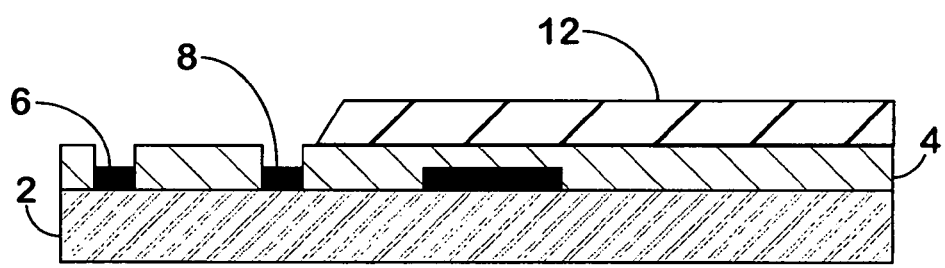

To begin the fabrication process, a sacrificial layer 12 is deposited on top of the passivation layer of the standard CMOS wafer 2, which in this case is silicon nitride layer 4. The MEMS device fabrication steps are all performed at low temperature on top of the complete CMOS wafer 2, leaving the circuitry therein undisturbed. Cuts in the passivation layer 4 are left during the CMOS IC design and sacrificial layer 12 is removed over these cuts if access to the metal contacts is desired. The exposed metal contacts 6 and 8 are then used to make connections between the MEMS microstructure and the CMOS circuitry in silicon CMOS wafer 2 below. This is illustrated in FIG. 2A.

In the preferred embodiment the microstructure may be composed of any metal, for example, Al, W, Ti, Ta, Cu, Ni, Mo, etc., but in the preferred embodiment would be made of aluminum. The selection of material for a particular microstructure layer is dictated by two factors. First, how much residual stress gradient in the material is acceptable for a particular application and, second, by the availability of a selective etchant that removes the portions of the microstructure which are undesired, while stopping on or having a low etch rate for the silicon nitride passivation layer 4 and the sacrificial layer 12.

Figure 3A:
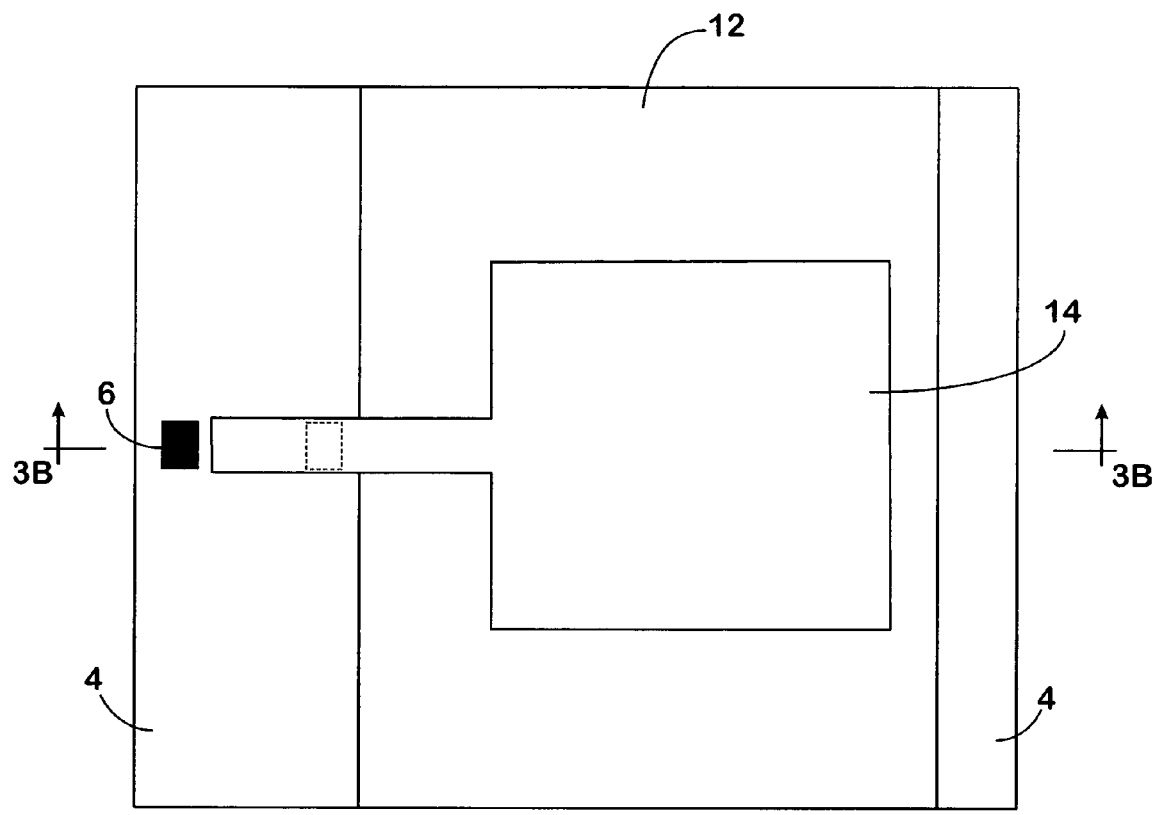
FIGS. 3A and 3B show a top view and a cross-sectional view respectively of the wafer of FIGS. 2A and 2B having a structural layer added thereon.
Figure 3B:
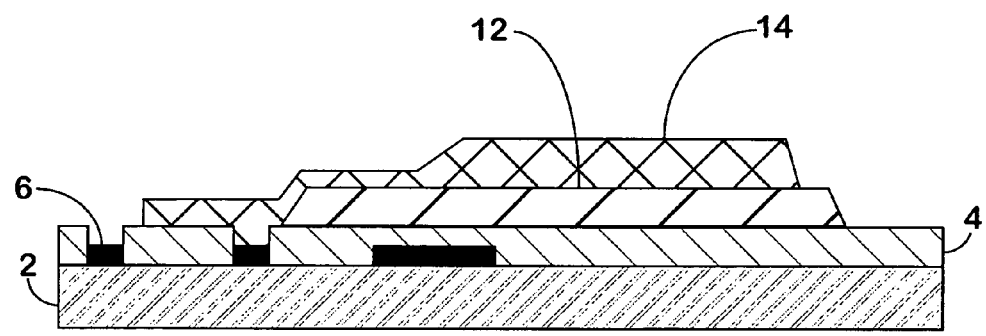

The deposition of the MEMS layer is shown in FIG. 3A and in cross section in FIG. 3B. MEMS microstructure 14 is deposited by methods known by those with ordinary skill in the art and the undesirable portions are etched away, thereby leaving the desired shape of the microstructure behind. The top view of FIG. 3B clearly shows the shape of the microstructure as being a paddle having a long thin beam attached to an anchor point, which in this case is metal contact 8.

Figure 4A:
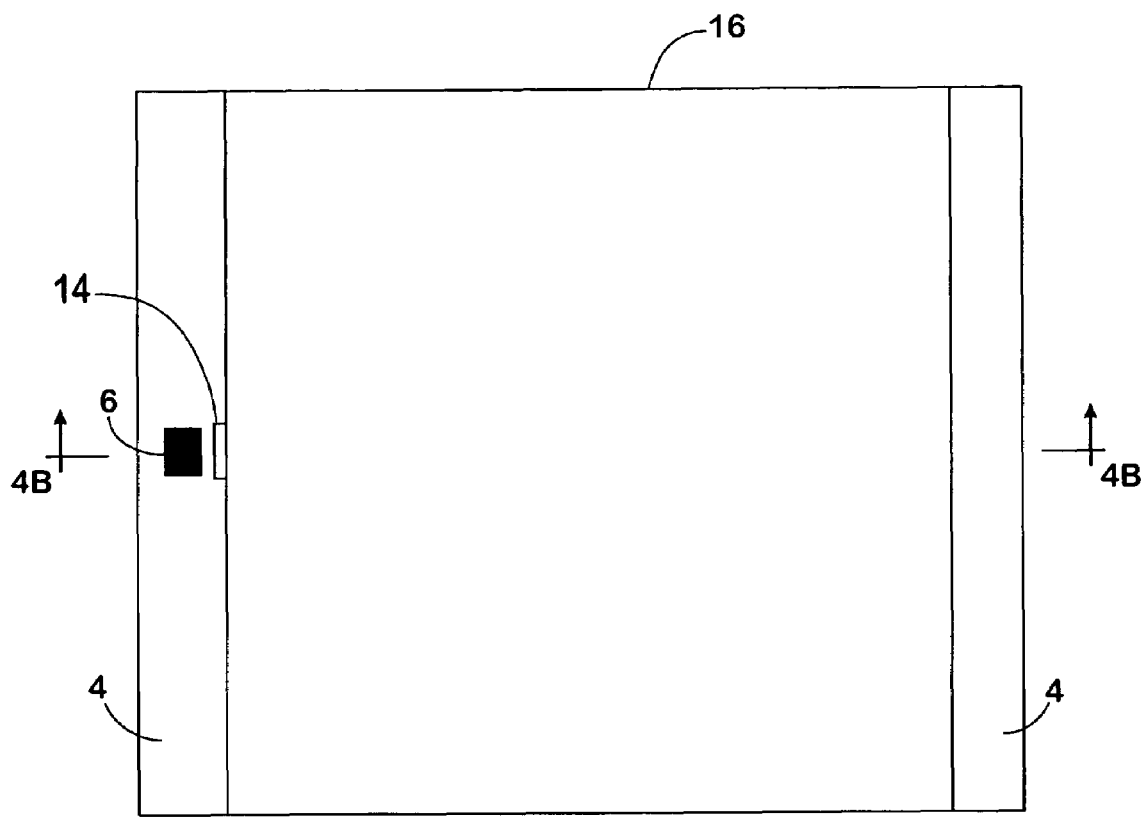
FIGS. 4A and 4B show a top view and a cross-sectional view respectively of the wafer of FIGS. 3A and 3B having a second sacrificial layer deposited thereon.
Figure 4B:
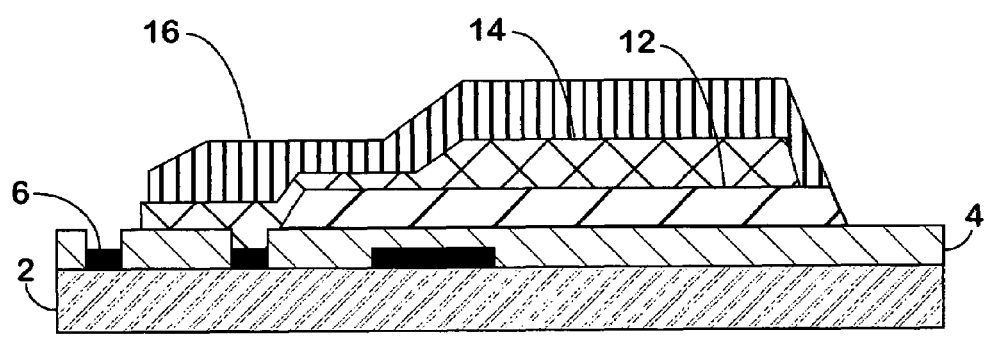

Next, as shown in FIG. 4A, and in cross section in FIG. 4B, a second sacrificial layer 16 is deposited over the microstructure. It can be seen from the top view that portions of the top sacrificial layer 16 will come into contact with portions of the bottom sacrificial layer 12, in particular, those areas near the edges of the paddle-shaped main body of the microstructure and those areas on either side of the thin connecting beam portion of the microstructure.

In the preferred embodiment, and, if possible as dictated by the shape of microstructure 14, sacrificial layers 12 and 16 will be of the same material and will have a connection to each other, such that when etchant is introduced, both layers will be etched away without the need to etch additional etchant entry holes. Alternatively, sacrificial layers 12 and 16 may be of different materials. Although not necessary in the construction of the microstructure of this example, more complex microstructures, or multiple microstructures in the same cavity may require etching away of various sacrificial layers at different times, making it necessary to use different materials for the sacrificial layers and different etchants.

The preferred material for sacrificial layers 12 and 14 is photoresist. Photoresist is chosen for this reason because it can be etched with an oxygen plasma gas, which is not destructive of aluminum microstructure 14, silicon nitride passivation layer 4 or seal layer 18. FIGS. 4A and 4B show the deposition of second sacrificial layer 16.

If sacrificial layers 12 and 16 are of different materials it is possible to etch them separately by selecting an etchant that is selective to one and not the other. It is even possible that a wet etch could be used with one of the sacrificial layers. For example, sacrificial layer 16 may be phosphorous-doped glass and the etchant may be hydrofluoric acid. This may be desirable because the wet etchants are generally faster acting than the dry etchants. As long as the microstructure is held in place by one or more other sacrificial layers, the surface tension problem will be avoided. In this case, it is only necessary that the last sacrificial layer binding the microstructure in place be removed using the dry-etchant process.

Figure 5A:
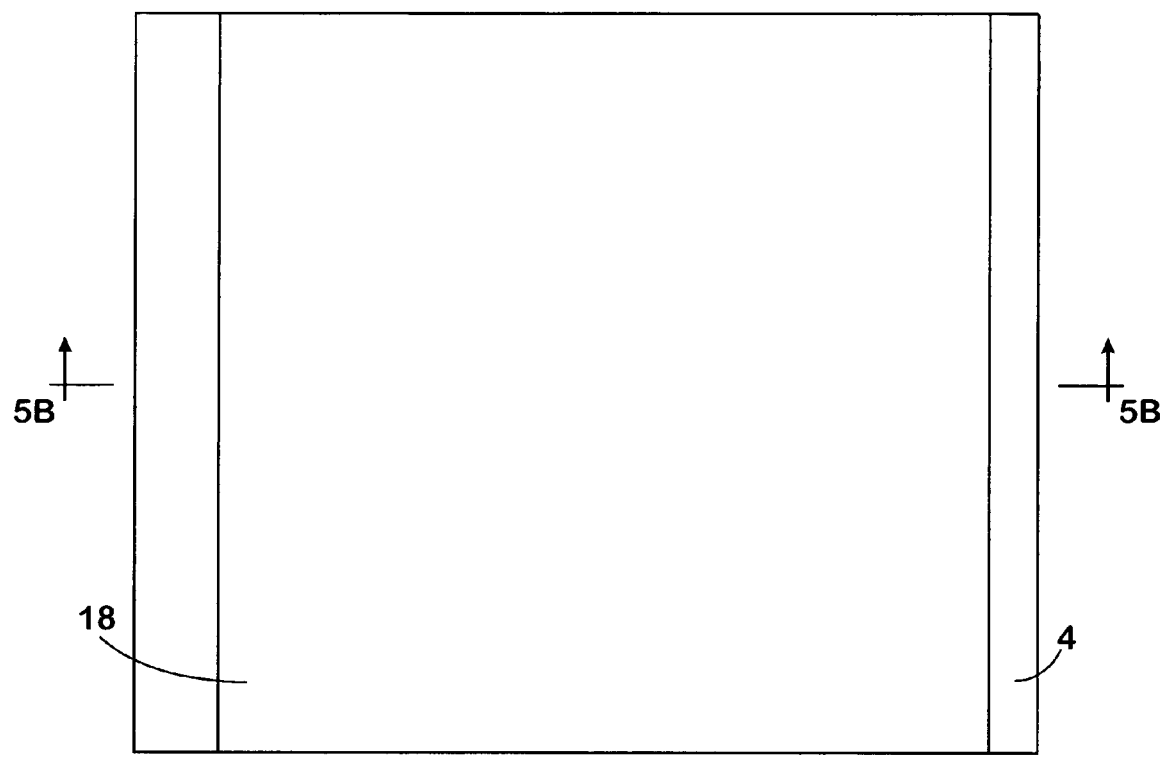
FIGS. 5A and 5B show a top view and a cross-sectional view respectively of the wafer of FIGS. 4A and 4B having a seal layer applied thereon.
Figure 5B:
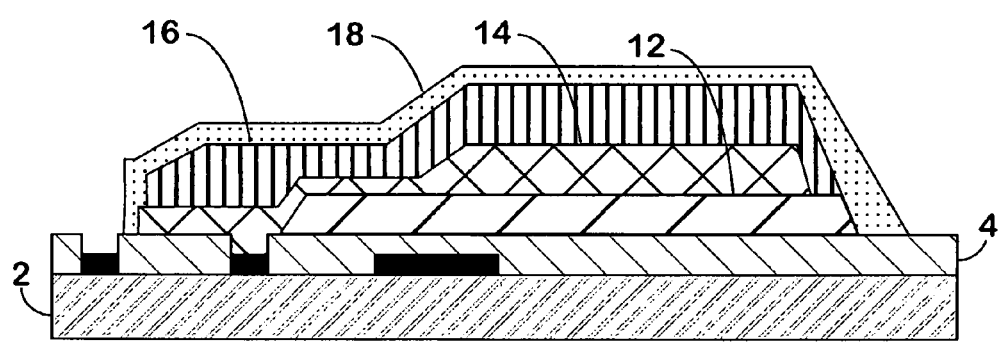

FIGS. 5A and 5B show the deposition of seal layer 18. This layer may be composed of an insulator or a conductor, depending on the desired electrical operation of the microstructure. Additionally, the seal layer must have a low enough residual stress and must be thick enough that the membrane created by the seal layer 18 will not buckle after the sacrificial layers 12 and 16 have been removed. In the preferred embodiment, seal layer 18 is the same metal as was chosen for the microstructure layer 14, but in alternate embodiments may be made of any material resistant to the etchant chosen. In the event an insulating material is chosen for seal layer 18, it may be patterned and removed to give access to the non-MEMS parts of the integrated circuit, such as bond pads 6 and 8. If seal layer 18 is a conductor, it may be contacting one or both of bond pads 6 or 8.

Figure 6A:
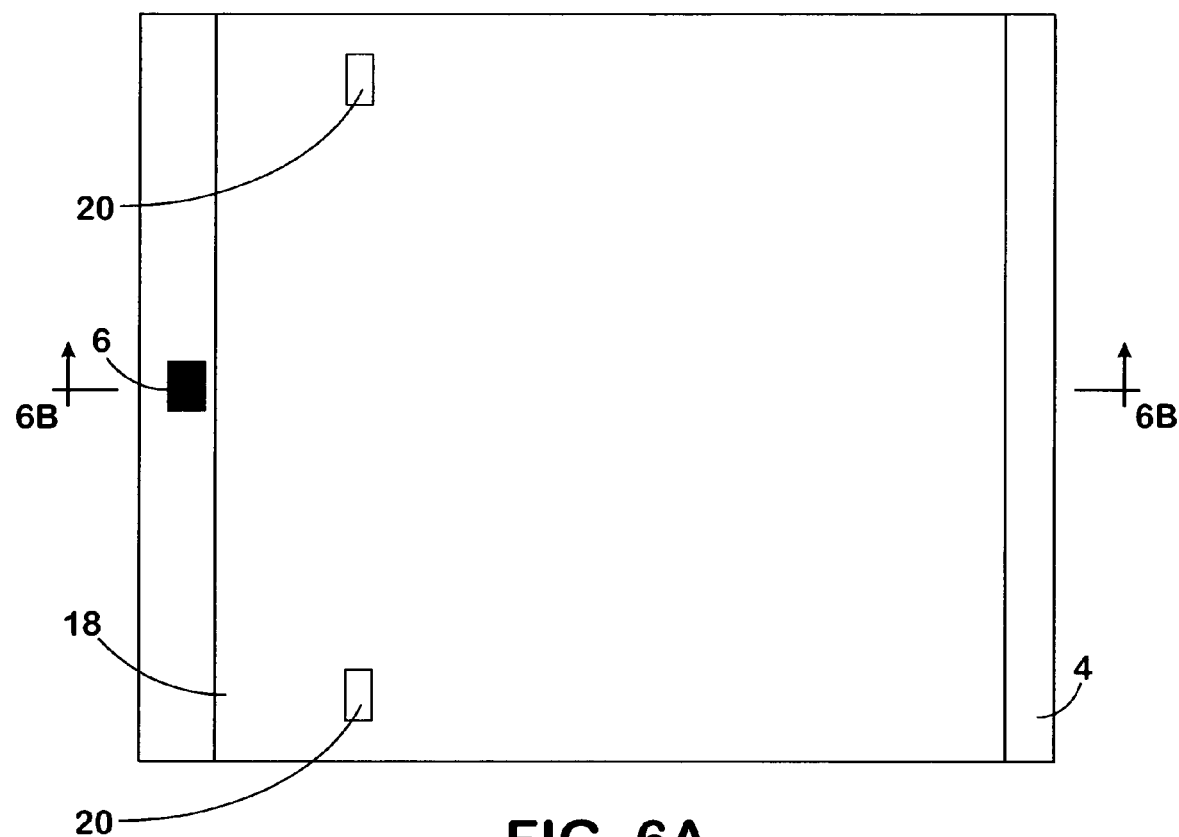
FIGS. 6A and 6B show a top view and a cross-sectional view respectively of the wafer of FIGS. 5A and 5B having etch holes drawn therein.
Figure 6B:
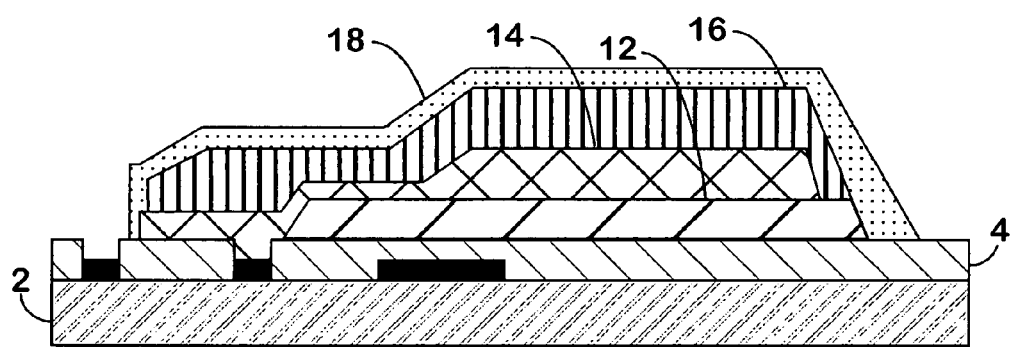
Figure 7A:
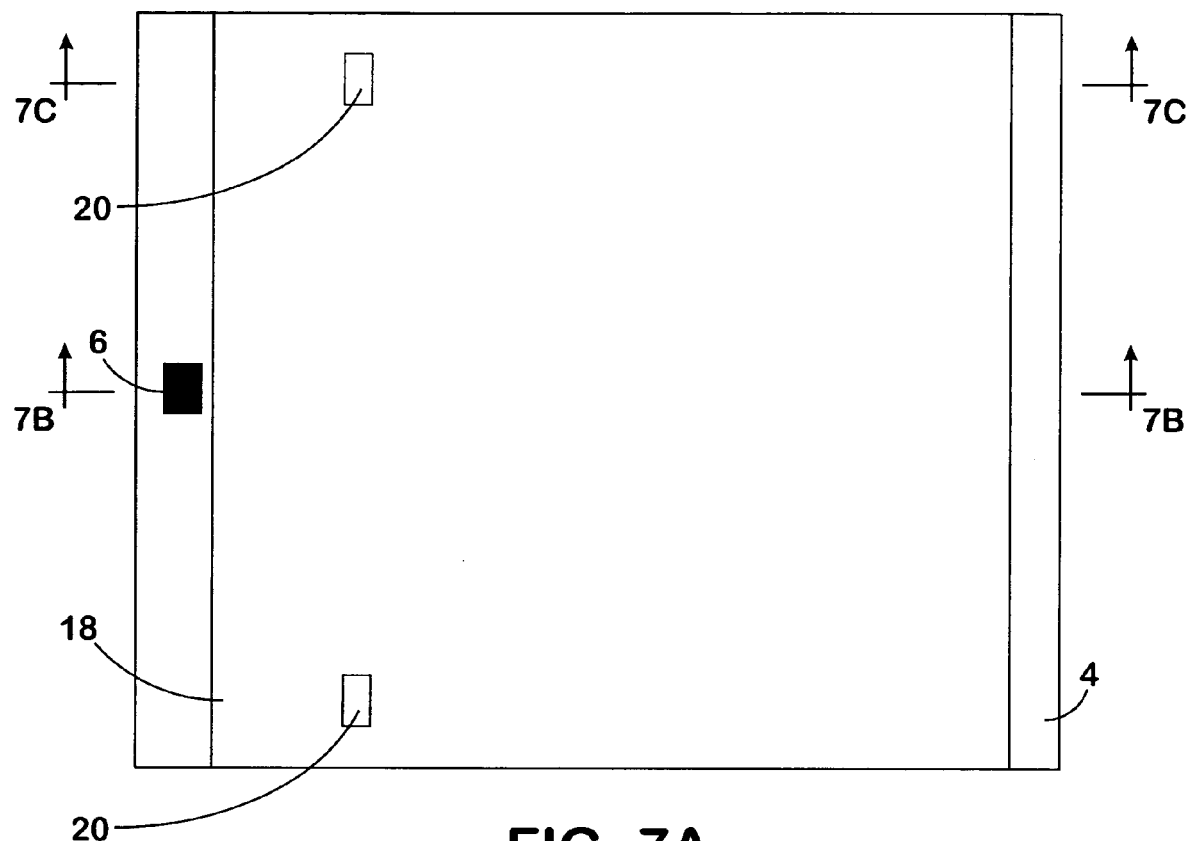
FIGS. 7A, 7B and 7C show a top view, a cross-sectional view along line 7B and a cross-sectional view along line 7C respectively of the wafer having the sacrificial layers removed by an enchant.
Figure 7B:
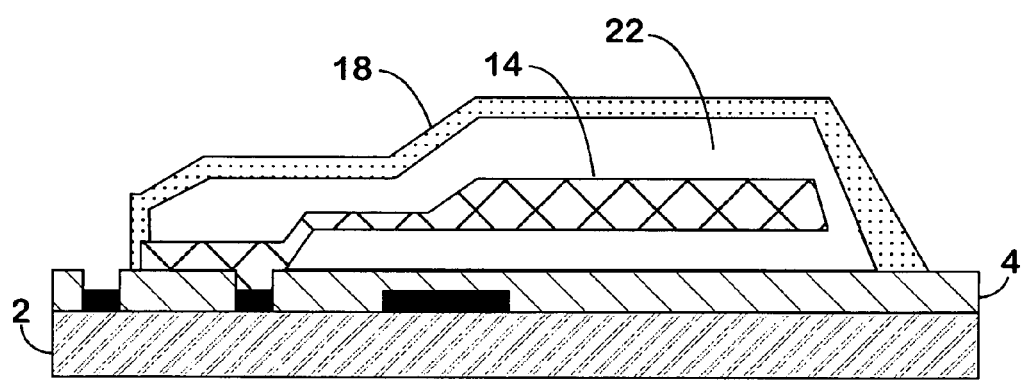
Figure 7C:
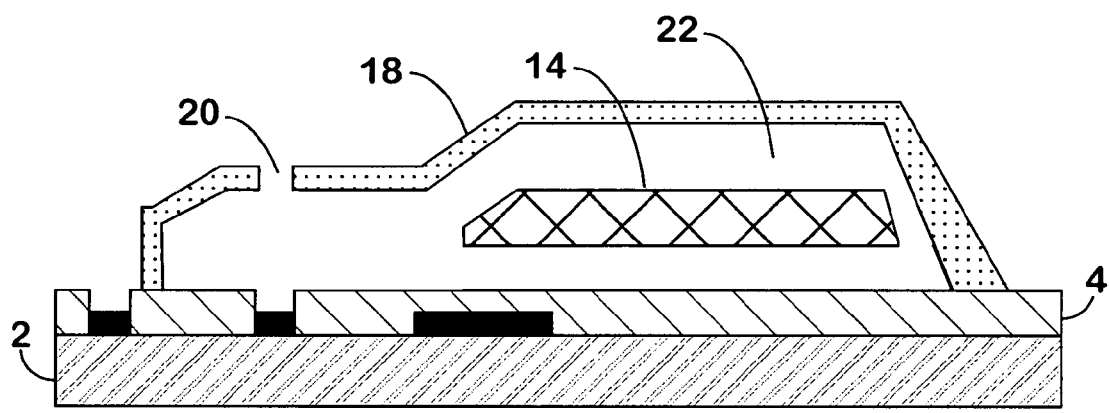

Next, one or more etchant access holes 20, shown in FIGS. 6A and 6B are etched into seal layer 18 such that communication can be established with sacrificial layers 12 and 16. This etch is done by any means well known to anyone of ordinary skill in the art. Preferably etch holes 20 will be as far away as possible from the actual MEMS microstructure. Next, as shown in FIGS. 7A, 7B and 7C, the etchant is introduced into holes 20 and sacrificial layers 12 and 16 are etched away, leaving void 22. FIG. 7B shows a cross-sectional view of the device through the center, while FIG. 7C shows a cross-sectional view through one of the etchant access holes. A dry plasma etchant is used to avoid problems created by the surface tension of a wet etchant. In the preferred embodiment, the etchant is oxygen plasma. Oxygen plasma was chosen because it is highly selective with respect to the etching sacrificial layers 12 and 14, which may be photoresist or other organic polymers, while having an extremely low etching rate for a wide variety of metals and insulators.

At this point, microstructure 14 is able to move vertically within the cavity created by open space 22 previously occupied by sacrificial layers 12 and 16, with beam 15 acting as a spring and contact pad 8 acting as an anchor point. Depending upon the distance from the etch access holes to the furthest point of sacrificial layers 12 or 16 to be removed, etching time using the oxygen plasma may be quite long. It is preferred for this reason that a barrel etcher be used in the etching process such that a plurality of wafers may be etched at the same time.

Figure 8A:
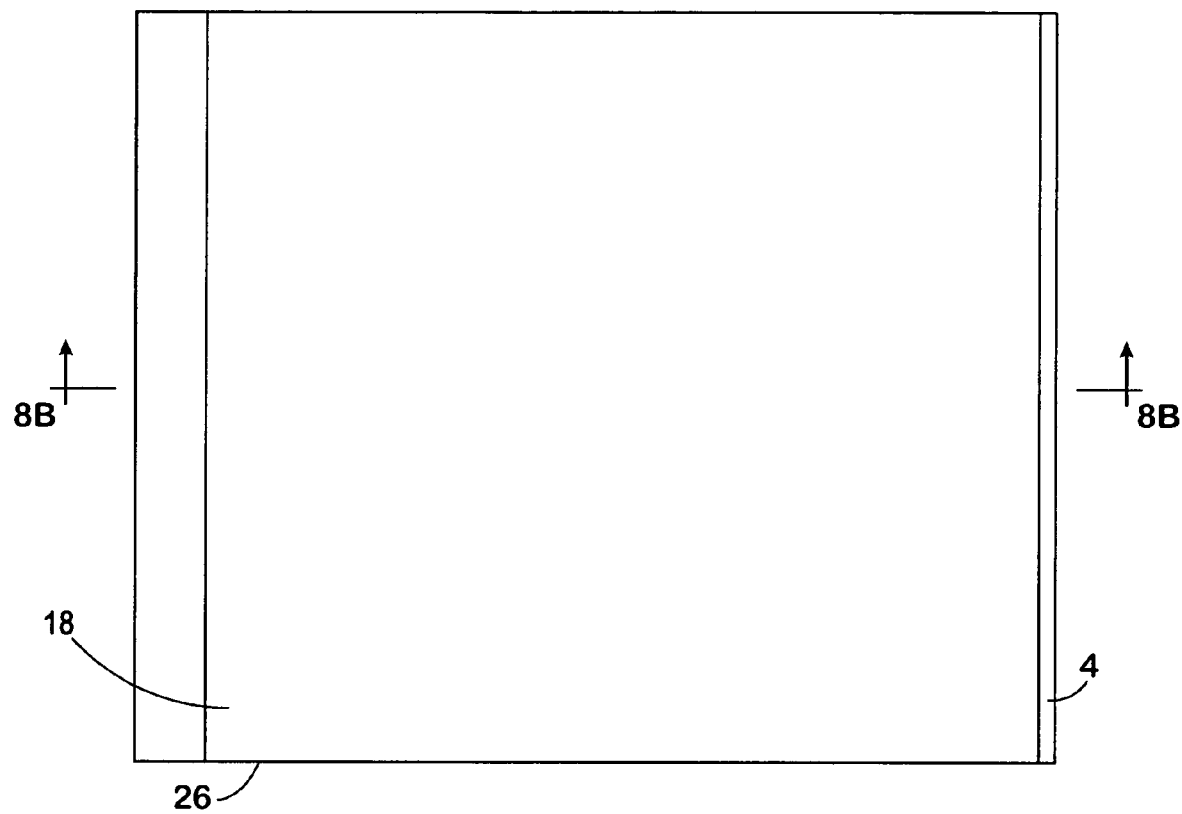
FIGS. 8A and 8B show a top view and a cross-sectional view respectively of the wafer having a second seal layer applied thereon, thereby sealing the etch holes.
Figure 8B:
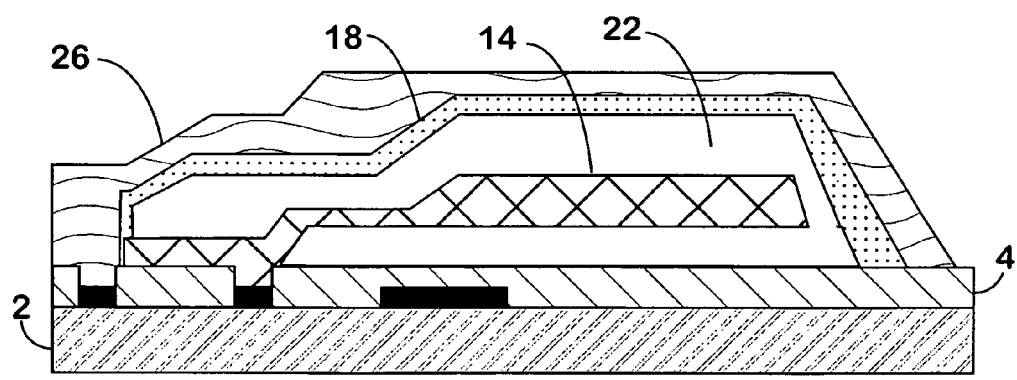
Figure 9A:
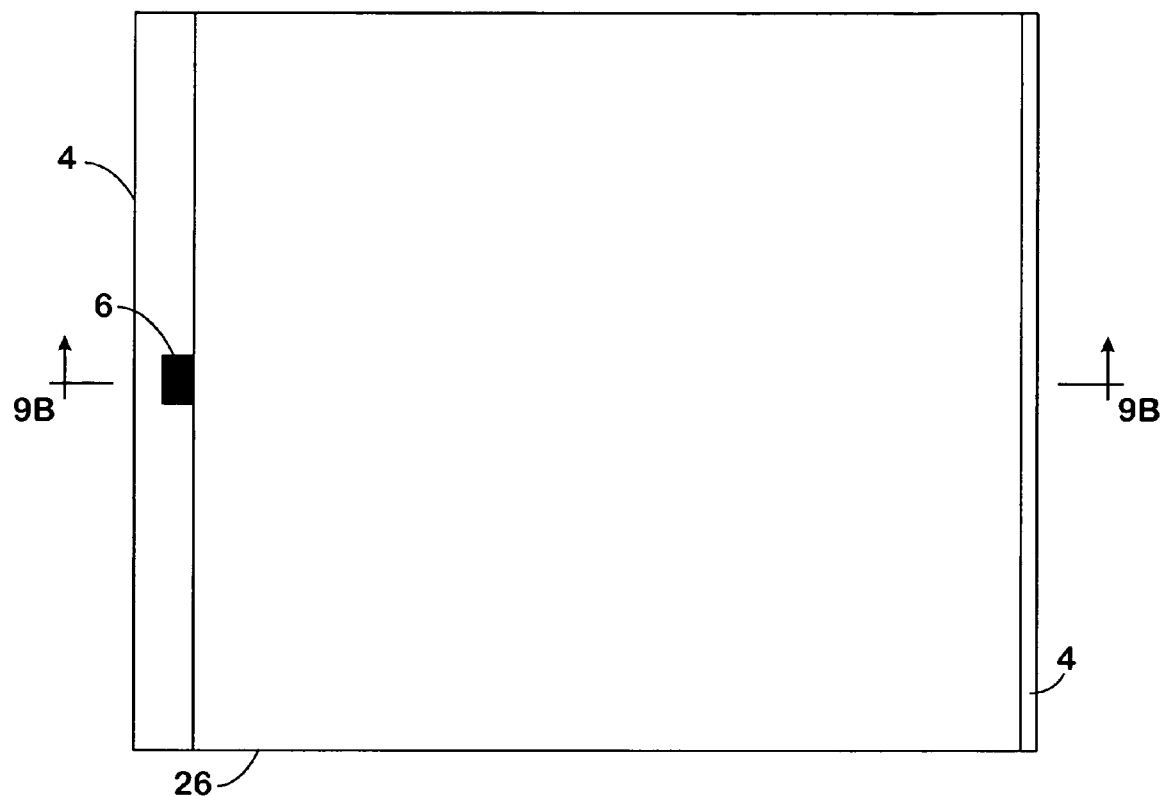
FIGS. 9A and 9B show a top view and a cross-sectional view respectively of the second seal layer having been removed from the contact pad on the base wafer.
Figure 9B:
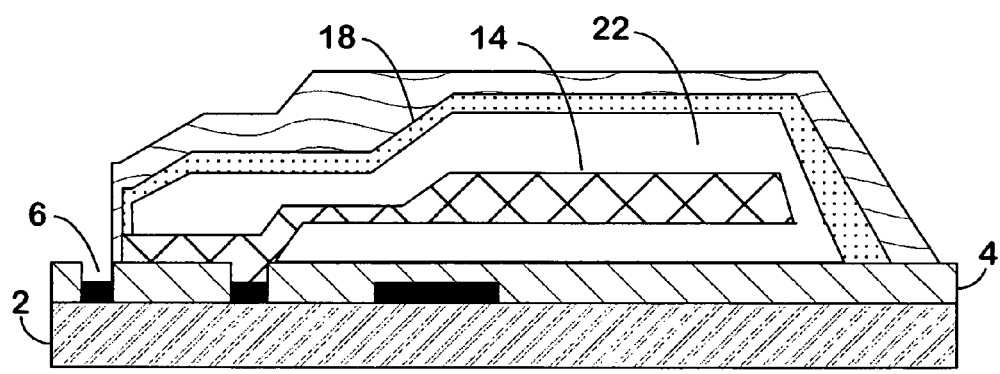

The final step, shown in FIG. 8A, is the application of a second seal layer 26 to seal etch holes 20. In the preferred embodiment, seal layer 26 is the same metal as seal layer 18 and MEMS microstructure 14. As shown in FIG. 9, if the second seal layer is not a conductor then it may be etched away using well known methods from the area over contact pad 6, or it may be left in electrical contact with compact pad 6. Final seal layer 26 may be etched away from contact pad 6, or, if seal layer 26 is composed of a conductor, may be left in place.

A simple microstructure that could be utilized as a Z-axis accelerometer has been described to show the general process of creating a microstructure in a sealed cavity using a dry-etch process. However, as realized by one or ordinary skill in the art, and as contemplated by the scope of this patent, the process may be used to build microstructures of more complexity, involving many combinations of sacrificial and structural layers, as long as the last sacrificial layers binding any microstructure component are removed with the dry-etch process. Additionally, alternative combinations of material may be utilized for the dry etchant and sacrificial layer combinations, as long as the etchant selected has a low etch rate with respect to the microstructure material and the material utilized for the passivation and seal layers. Additionally, movable structures consisting of many layers of stacked sacrificial and structural materials are within the scope of this invention.

I claim:

1. A method of fabricating a microstructure in a sealed cavity comprising the steps of:

providing a substrate having a substantially planar support surface;

depositing a first layer of sacrificial material over said planar support surface;

depositing an etchable layer of structural material over said first layer of sacrificial material;

forming a microstructure on said support surface by etching said layer of structural material, said microstructure contacting said substrate at least at an anchor point;

depositing a second layer of sacrificial material over said microstructure;

depositing a cap layer over said second layer of sacrificial material, said cap layer extending from points on said support surface, whereby said cap layer and said support surface define a capsule about an interior region containing said microstructure and said first and second sacrificial layers;

forming one or more holes in said cap layer;

introducing a dry plasma etchant into said interior region through said one or more holes, wherein said sacrificial material is chosen to have a high etch rate differential with respect to said structural material, so that said dry plasma etchant removes said first and second sacrificial layers while leaving said microstructure and said substrate substantially intact, thereby releasing said microstructure as a movable structure secured at said anchor point to said substrate; and sealing said one or more holes in said cap layer with a seal layer, thereby forming a sealed cavity that encapsulates said movable microstructure, said sealed cavity being defined by said seal layer and said planar support surface, wherein said etchant is oxygen plasma, said sacrificial material is photoresist and wherein said structural material is aluminum.

2. The method of claim 1 wherein said substrate is a silicon wafer having a layer of silicon nitride deposited thereon.

3. The method of claim 1 wherein said etchant has a high etch rate with respect to said sacrificial material and a low etch rate with respect to said structural material and with respect to the materials forming said substrate and said cap layer.

4. The method of claim 1 wherein said structural material is resistant to said etchant.

5. The method of claim 1, wherein the step of introducing said dry plasma etchant into said interior region through said one or more holes is performed using a barrel etcher.

6. The method of claim 1, wherein said one or more holes are etched into said cap layer so as to establish communication with said first and second layers of sacrificial material.

* * * * *